United States Patent

Kyösti et al.

(10) Patent No.: US 9,705,190 B2
(45) Date of Patent: Jul. 11, 2017

(54) OVER-THE-AIR TEST

(75) Inventors: Pekka Kyösti, Jokirinne (FI); Tommi Jämsä, Oulu (FI); Tommi Laitinen, Espoo (FI)

(73) Assignee: Keysight Technologies Singapore (Holdings) Ptd. Ltd., Singapore (SG)

( * ) Notice: Subject to any disclaimer, the term of this patent is extended or adjusted under 35 U.S.C. 154(b) by 809 days.

(21) Appl. No.: 13/038,703

(22) Filed: Mar. 2, 2011

(65) Prior Publication Data

US 2012/0225624 A1    Sep. 6, 2012

(51) Int. Cl.
| | |
|---|---|
| H04B 3/46 | (2015.01) |
| H01Q 3/26 | (2006.01) |
| H01Q 21/20 | (2006.01) |
| H04B 17/00 | (2015.01) |
| H04B 7/06 | (2006.01) |
| G01R 29/10 | (2006.01) |

(52) U.S. Cl.
CPC ......... *H01Q 3/2605* (2013.01); *H01Q 21/205* (2013.01); *H04B 7/0617* (2013.01); *H04B 17/0085* (2013.01); *H04B 17/0087* (2013.01); *G01R 29/10* (2013.01)

(58) Field of Classification Search
USPC .............................. 455/67.11, 67.13; 375/224
See application file for complete search history.

(56) References Cited

U.S. PATENT DOCUMENTS

| | | | |
|---|---|---|---|
| 7,599,666 B2 * | 10/2009 | Hamalainen et al. .......... 455/69 |
| 8,412,112 B2 * | 4/2013 | Foegelle .................... 455/67.12 |
| 2005/0101315 A1 * | 5/2005 | Yamaguchi et al. .......... 455/423 |
| 2006/0079192 A1 * | 4/2006 | Smith ......................... 455/226.3 |
| 2006/0148429 A1 * | 7/2006 | Inogai et al. ............... 455/115.1 |
| 2007/0183461 A1 | 8/2007 | Eyal et al. |
| 2008/0056340 A1 * | 3/2008 | Foegelle ....................... 375/224 |
| 2008/0159239 A1 | 7/2008 | Odlyzko et al. |
| 2008/0287086 A1 * | 11/2008 | Gozen .................. H04B 1/1669 455/311 |
| 2009/0116456 A1 * | 5/2009 | Nuutinen et al. .............. 370/335 |
| 2010/0130135 A1 * | 5/2010 | Wang et al. ................ 455/67.11 |
| 2010/0285753 A1 * | 11/2010 | Foegelle .................... 455/67.12 |

(Continued)

FOREIGN PATENT DOCUMENTS

| | | |
|---|---|---|
| EP | 2624639 A1 | 8/2013 |
| JP | 11340930 A | 12/1999 |

(Continued)

OTHER PUBLICATIONS

Toivanen et al., "Reproduction of Arbitrary Multipath Environments in Laboratory Conditions", IEEE Transactions on Instrumentation and Measurement, vol. 60, No. 1, pp. 275-281 (2011).

(Continued)

*Primary Examiner* — Nay A Maung
*Assistant Examiner* — Erica Fleming-Hall (57) ABSTRACT

An apparatus forms a weight for each signal path associated with an antenna of a plurality of antennas around a test zone in an over-the-air chamber by a comparison of a desired target electric field based on a radio channel model and an electric field obtainable by the plane waves associated with the test zone, the plane waves being transmittable by the antennas and being based on at least one basis waveform in each signal path.

27 Claims, 5 Drawing Sheets

(56) References Cited

U.S. PATENT DOCUMENTS

| | | | |
|---|---|---|---|
| 2011/0009071 A1* | 1/2011 | Stager et al. | 455/67.16 |
| 2011/0189962 A1* | 8/2011 | Kyosti et al. | 455/67.11 |
| 2011/0200084 A1* | 8/2011 | Griesing et al. | 375/224 |
| 2011/0207490 A1 | 8/2011 | Lee et al. | |
| 2011/0299570 A1* | 12/2011 | Reed | 375/130 |
| 2011/0306306 A1* | 12/2011 | Reed | 455/67.11 |
| 2012/0071107 A1 | 3/2012 | Falck et al. | |
| 2012/0282975 A1 | 11/2012 | Mujtaba et al. | |
| 2013/0052962 A1* | 2/2013 | Hansen | 455/67.12 |
| 2013/0231060 A1* | 9/2013 | Ozaki et al. | 455/67.11 |

FOREIGN PATENT DOCUMENTS

| | | | |
|---|---|---|---|
| JP | 00151499 A | 5/2000 | |
| JP | 00183832 A | 6/2000 | |
| WO | 0247461 A2 | 6/2002 | |
| WO | 2008082753 A1 | 7/2008 | |
| WO | 2010051517 A2 | 5/2010 | |
| WO | WO2010093999 A2 | 8/2010 | |
| WO | WO2010094000 A2 | 8/2010 | |
| WO | 2010139840 A1 | 12/2010 | |
| WO | WO2010139840 A1 | 12/2010 | |
| WO | 2012063491 A1 | 5/2012 | |

OTHER PUBLICATIONS

Ville Mottonen, International Search Report for corresponding PCT Application No. PCT/FI2011/050190, pp. 1-5 (Dec. 7, 2011).

Laitinen et al., "On a MIMO-OTA Testing Based on Multi-Probe Technology", Electromagnetic Theory (EMTS), 2010 URSI, International Symposium on, IEEE, pp. 227-230 (Aug. 16, 2010).

Betty Yang, European Search Report for corresponding European Application No. EP11860069, pp. 1-7 (Jul. 21, 2014).

Office Action for corresponding Chinese Application No. 201180070582.5, pp. 1-7 (Translation 1-9) Aug. 20, 2014.

Reason for Rejection dated Feb. 18, 2015 regarding JP2013555911, and English translation.

Office Action mailed Dec. 24, 2015 in Chinese Application No. 201180070582.5 (Unofficial/non-certified translation provided by foreign agent included).

Written Opinion dated Dec. 7, 2011 for PCT Application PCT/FI2011/050190.

International Preliminary Report on Patentability dated Sep. 3, 2013 for PCT Application No. PCT/FI2011/050190.

Office Action mailed Oct. 28, 2016 in Chinese Application No. 201180070582.5 (Unofficial/non-certified translation provided by foreign agent included).

Notification of Decision to Grant dated Jan. 24, 2017 in Chinese Application No. 201180070582.5 (Unofficial/non-certified translation provided by foreign agent included).

* cited by examiner

OVER-THE-AIR TEST

BACKGROUND

Field

The invention relates to over-the-air testing of a device in an anechoic chamber.

Description of the Related Art

When a radio frequency signal is transmitted from a transmitter to a receiver, the signal propagates in a radio channel along one or more paths having different angles of arrivals, signal delays, polarizations and powers. Also a frequency may change due to the Doppler effect which may cause variation in signal strength and fadings of different durations in the received signal. The transmitter and the receiver are not ideal either. In addition, noise and interference due to other transmitters interfere with the radio connection.

A transmitter and a receiver can be tested using a radio channel emulator emulating real circumstances. In a digital radio channel emulator, a radio channel is usually modelled with an FIR filter (Finite Impulse Response). A traditional radio channel emulation test is performed via a conducted connection such that a transmitter and a receiver are coupled together via at least one cable.

Communication between a DUT (Device Under Test) and a base station of a radio system can be tested using an OTA (Over The Air) test, where a real DUT, such a subscriber terminal, is surrounded by a plurality of antennas of an emulator in an anechoic chamber. The emulator may be coupled to or act as a base station and emulate propagation paths between the subscriber terminal and the base station according to a channel model by generating independent Rayleigh faded signals, for example. An antenna or a combination of antennas transmits the independently prefaded communication signals to the DUT on the basis of weights determined by the emulated radio channel. However, the formation of weights and thus signals transmitted by the antennas have their specific limits and hence there is need for a new approach.

SUMMARY

The following presents a simplified summary of the invention in order to provide a basic understanding of some aspects of the invention. This summary is not an extensive overview of the invention. It is not intended to identify key elements of the invention or to delineate the scope of the invention. Its sole purpose is to present some concepts of the invention in a simplified form as a prelude to the more detailed description that will be presented below.

An aspect of the invention relates to apparatus configured to form a weight for each signal path associated with an antenna of a plurality of antennas around a test zone in an over-the-air chamber by a comparison of a desired target electric field based on a radio channel model and an electric field obtainable by the plane waves associated with the test zone, the plane waves being transmittable by the antennas and being based on at least one basis waveform in each signal path.

A further aspect of the invention is a method comprising forming a weight for each signal path associated with an antenna of a plurality of antennas around a test zone in an over-the-air chamber by comparing of a desired target electric field based on a radio channel model and an electric field obtainable by the plane waves associated with the test zone, the plane waves being transmittable by the antennas and being based on at least one basis waveform in each signal path.

A further aspect of the invention is an apparatus comprising at least one processor and at least one memory including a computer program code, the at least one memory and the computer program code configured to, with the at least one processor, cause the apparatus at least: to form a weight for each signal path associated with an antenna of a plurality of antennas around a test zone in an over-the-air chamber by comparing of a desired target electric field based on a radio channel model and an electric field obtainable by the plane waves associated with the test zone, the plane waves being transmittable by the antennas and being based on at least one basis waveform in each signal path.

A further aspect of the invention is a transmission method comprising transmitting deterministic basis waveforms from the antenna elements of an over-the-air chamber for forming a plurality of predetermined plane waves in a test zone, the predetermined plane waves forming an emulated radio channel for communication with the device under test in the test zone.

Although various aspects, embodiments and features of the invention are recited independently, it should be appreciated that all combinations of the various aspects, embodiments and features of the invention are possible and within the scope of the present invention as claimed.

BRIEF DESCRIPTION OF THE DRAWINGS

In the following, the invention will be described in greater detail by means of exemplary embodiments with reference to the attached drawings, in which.

DETAILED DESCRIPTION

Exemplary embodiments of the present invention will be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Although the specification may refer to "an", "one", or "some" embodiment(s) in several locations, this does not necessarily mean that each such reference is to the same embodiment(s), or that the feature only applies to a single embodiment. Single features of different embodiments may also be combined to provide other embodiments. Therefore, all words and expressions should be interpreted broadly and they are intended to illustrate, not to restrict, each embodiment.

Figure 1:
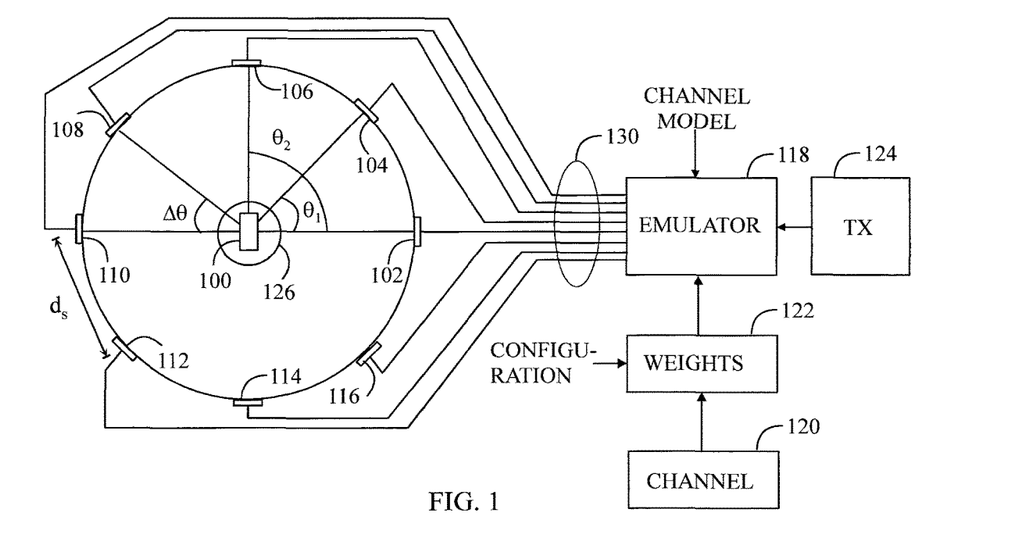
FIG. 1 shows a plane geometrical embodiment of an OTA test chamber.

FIG. 1 presents an OTA test chamber. A DUT 100, which may be a subscriber terminal, is in the centre and antenna elements 102, 104, 106, 108, 110, 112, 114 and 116 may be around the DUT 100. They may have a uniform spacing (e.g. 45° between each of the 8 elements). The DUT 100, in turn, may be in a test zone 126. The test zone 126 is the same as or a part of a quiet zone. Let us denote the directions of K OTA antennas with $\theta_k$, k=1, ..., K and the spacing of an antenna in the angle domain with $\Delta\theta$, where K refers to the number of antenna elements 102 to 116. The angle $\Delta\theta$ expresses a measure of the angular separation of two antenna elements 102 to 116 with respect to the electronic device 100. Each of the antenna elements may be connected to a single emulator output port of an emulator 118 such as EB (Elektrobit) Propsim® F8 and hence each antenna element may receive a signal through one signal path from the emulator 118.

The test chamber may be an anechoic room. The emulator 118 may comprise FIR filters for weighting and delaying each signal path 130 from the transmitter 124 to the antenna 102 to 116. Additionally or alternatively, the emulator 118 may comprise a processor, a memory and a suitable computer program for providing the antenna channels.

The distance between the DUT 100 and the antenna elements 102 to 116 may be the same or the antennas 102 to 116 may also be at different distances from the DUT 100. Correspondingly, the antenna elements 102 to 116 may only be placed in a sector instead of being placed at a full angle or a full solid angle. The antennas 102 to 116 may also be movable. In any case, the positions of the antennas 100 to 116 are predetermined at each moment with respect to the test zone 126.

The emulator 118 may be coupled to a transmitter 124 using the at least one output connector of the transmitter 124. The transmitter 124 may be a base station 124 of a radio system or the like. The DUT 100 may act as a receiving subscriber terminal of the radio system or the like. It may be assumed that DUT antenna characteristics are unknown and thus the information may be ignored.

A channel bank 120 may have a plurality of radio channel models in its memory or a radio channel is formed in real time by hard ware, for example. A radio channel model may be a play back model based on a channel recorded from a real radio system or it may be an artificially generated model or it may be a combination of a playback model and an artificially generated model. A certain radio channel may be selected to be emulated. A weight generator 122 may, hence, receive data on the radio channel which define the environment in which the DUT 100 should receive communication signals from a transmitter 124. The weight generator 122 also has the information on the configuration of the antennas 102 to 116 with respect to the DUT 100 (distance from DUT, angle with respect to DUT and polarization of signals, for example). The weight generator 122 may form a weight for each signal path 130 from the emulator 118 to an antenna 102 to 116 on the basis of the predefined information with respect to the antennas 102 to 116, a form of transmission from the antennas 102 to 116, the desired electric field in the test zone 126, for example, and feed the weights to the emulator 118 in order to form a desired radio channel between the transmitter 124 and the DUT 100.

The form of transmission from the antennas 102 to 116 to the test zone 126 may be based on plane waves. Each plane wave may, in turn, be based on a plurality of basis waveforms. For example, a sine wave may be a basis waveform. However, also other forms of basis waveforms could be used. A superposition of different sine waves may be made to result in a plane wave if sine waves have proper values of their parameters which may be amplitude, phase, frequency and direction. Usually at least one of the parameters differs in different sine waves. The at least one sine wave may be based on the carrier of the transmitter 124. A Rayleigh fading may be created by sine waves of different frequencies.

The purpose of the transmission of the plane waves from the antennas 102 to 116 to the test zone 126 is to form a desired radio channel between the transmitter 124 and the DUT 100 on the basis of superposition of a plurality of plane waves in the test zone 126 transmitted by the antennas 102 to 116. A single plane wave is formed using a plurality of antennas, and each emulated path of the multipath propagation of the radio channel is based on a plurality of plane waves.

According to the superposition principle, the combined response of plane waves in the test zone 126 at each moment is the sum of the responses of each plane wave separately. When the plane waves interact in the test zone 126 they reconstruct the effects the same or similar to what are caused to a communication signal in the desired radio channel. The communication signal comprises at least one carrier wave mixed with a message signal. The plane waves may be formed on the basis of each carrier wave transmitted by the transmitter. The final electric field in the test zone 126 depends on the plane waves and the actual message signals mixed with the carrier waves.

A plane wave within the test zone 126 heading to a certain direction which may be defined as an AoA (Angle of Arrival), can be formed if the angular spacing $\Delta\theta$ of OTA antennas 102 to 116 is dense enough and the configuration of the OTA antennas is predetermined. The following inequality should hold in the case of uniform OTA antenna spacings $$\Delta\theta < \frac{\lambda}{D}, \tag{1}$$

where D is a diameter of the test zone 126 and $\lambda$ is a wavelength. The required diameter of the test zone 126 may depend on the size of the DUT 100. In practice, the sampling should be at least a little denser than defined in (1). However, the requirement is not an obstacle to realize the positions of the antennas in an OTA chamber.

The weight generator 122 may form a weight for each signal path 130 associated with an antenna of the plurality of antennas 102 to 116 around the DUT 100 in an over-the-air chamber by a comparison of a desired target field of the channel model and a field in the test zone 126 obtainable by the plane waves based on at least one basis waveform in each signal path 130. The weights of each plane wave for each antenna may be formed using three methods below, for example, without limiting to them.

In an embodiment, each weight $g_k$ of a single plane wave for a signal path of an antenna may be obtained by optimizing a root-mean-square error between the target electric field and the resulting field on sampling points within the test zone 126, for example. The target electric field may be calculated, simulated or measured in a test beforehand. The target field may be either vertically (z-polarized) or horizontally (perpendicular to vertical) polarized or both.

Figure 2:
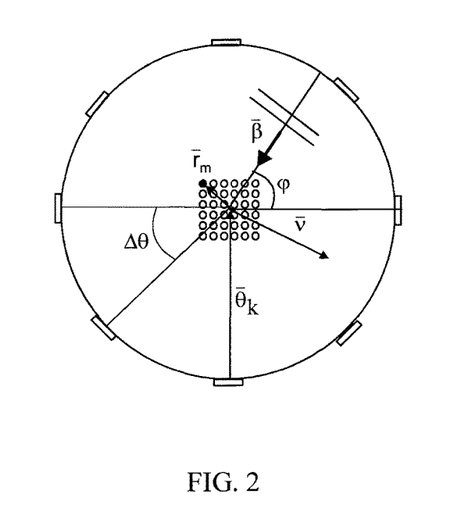
FIG. 2 illustrates some variables needed in equations.

Assume now for simplicity a case with a vertically polarized target field $e_z$. The situation is similar to the case with the horizontally polarized target field. FIG. 2 presents some variables used in the following comparison operation. An error $E_e(\Theta, G)$ of the cost function to be optimized may be:

$$E_e(\Theta, G) = \sqrt{\frac{1}{M}\sum_{m=1}^{M}|e_z(\varphi, \bar{r}_m) - \tilde{e}_z(\Theta, G, \bar{r}_m)|^2} \quad (2)$$

where M is the number of locations in the test zone 126 or at its circumference, $\Theta=\{\theta_k\}$, $\theta_k \in [0,2\pi]$ is a vector of OTA antenna directions, $G=\{g_k\}$, $g_k \in C$ is a vector of OTA antenna complex weights, k refers to the $k^{th}$ OTA antenna, $e_z(\phi,\bar{r}_m)$ is a complex target field in a location $\bar{r}_m$ of a plane wave with AoA $\phi$, $\tilde{e}_z(\Theta,G,\bar{r}_m)$ is a complex field at a location $\bar{r}_m$ with parameters $\Theta$ and G, and $\bar{r}_m$ is a location vector pointing to $m^{th}$ sample point. The purpose is to compare the target electric field and the electric field obtainable with the OTA antennas of the predetermined configuration at a plurality of locations $\bar{r}_m$ in the test zone or at the circumference of the test zone.

The target field, which is the (theoretical) reference field that should be at least approximately achieved by the plane waves, may be expressed as $$e_z(\phi,\bar{r}_m) = E_0 \exp(-j\bar{\beta}\cdot\bar{r}_m) \quad (3)$$

where $\bar{\beta}$ is a wave vector pointing parallel to a AoA direction, $\|\bar{\beta}\|=\beta=2\pi/\lambda_0$, $\beta=2\pi/\lambda_0$ is a wave number, $\lambda_0$ is the wavelength corresponding to a carrier frequency $f_c$, and $E_0=1$. Assume that the origin of the coordinate system is in the centre of the test zone 126 for simplicity. The resulting unnormalized field formed by K OTA antennas may become $$\bar{e}_z(\Theta, G, \bar{r}_m) = \sum_{k=1}^{K} PL(d_{k,m})\exp(-j\beta\bar{r}_m\cdot\bar{\theta}_k)g_k \quad (4)$$

where $PL(d)=20\log_{10}(d)+46.4+20\log_{10}(f_c/5.0)$ is the free space path loss, $d_{k,m}=\|\bar{\theta}_k+\bar{r}_m\|$ is a distance from OTA antenna k to a location $\bar{r}_m$ and $\bar{\theta}_k$ is a vector from OTA antenna k to the origin. If the distance from OTA antennas to the test zone 126 is large compared to dimensions of the test zone 126, which is normally the case, the path loss term PL may be neglected in equation (4). The resulting field $\bar{e}_z(\Theta,G,\bar{r}_m)$ may be normalized over different sampling points $\bar{r}_m$ such that the field at the origin is equal to zero (i.e. $\tilde{e}_z(\Theta,G,\bar{0})=1$). Thus, equation (4) may be normalized by multiplying the unnormalized field formed by K OTA antennas by an inverse of the electric field at the origin as follows:

$$\tilde{e}_z(\Theta,G,\bar{r}_m) = \bar{e}_z(\Theta,G,\bar{r}_m)|\bar{e}_z(\Theta,G,\bar{0})|^{-1}. \quad (5)$$

When the error $E_e(\Theta, G)$ is at the minimum or below a predetermined threshold Th (the threshold having a higher value than the minimum), the weights G, which may be expressed as a vector, may be selected to be used in the emulator 118. The weights G may be saved in a memory to be used later. The weights determine the directions (together with the antennas), phases and amplitudes of the plane waves, and the emulated radio channel is thus based on a superposition of plane waves in the test zone 126.

In an embodiment, each weight $g_k$ of a single plane wave for a signal path of an antenna may be obtained by utilizing a Fourier transform technique presented below. Assume now a vertically polarized target electric field, although the technique may similarly be applied for horizontally polarized target electric fields. The Fourier technique for obtaining the weights is based on an expression of a target field in the test zone 126 around the DUT 100 at a distance $|\bar{r}|$ from the centre of the test zone 126 in terms of a finite Fourier expansion. For the case with AoA of $\phi=0$, this may be written as $$e_z(\phi,\bar{r}) = \sum_{m'=-M'}^{M'} c_{m',0}e^{jm'\Delta\theta}, \quad (6)$$

where $\Delta\theta$ is an angular separation of the OTA antennas. The Fourier expansion can be assumed to be finite due to the well-known cut-off properties of the spherical waves. According to a basic rule, M'=round$\{\beta|\bar{r}|\}$, where $\beta$ is a wave number. Here the "round" operation rounds the number inside the curly brackets to the nearest positive integer. In general, M' may also be greater than round$\{\beta|\bar{r}|\}$.

Hence, the truncation number M' and the set of coefficients $c_{m',0}$ for m'=-M' ... M' determine the target electric field on the intersection line (circumference of circle of radius $|\bar{r}|$) through the expansion (6). By defining the inverse discrete Fourier transformation (IDFT) as follows:

$$[c_{-M',0}, c_{-M'+1,0} \ldots c_{M'-1,0}, c_{M',0}] = \quad (7)$$

$$IDFT\begin{bmatrix} e_z\left(\Delta\theta = 0\cdot\frac{2\pi}{2M'+1}, \bar{r}\right), \\ e_z\left(\theta = 1\cdot\frac{2\pi}{2M'+1}, \bar{r}\right)\ldots \\ e_z\left(\Delta\theta = 2M'\cdot\frac{2\pi}{2M'+1}, \bar{r}\right) \end{bmatrix}.$$

This provides a set of coefficients $c_{m',0}$ for m'=-M' ... M'. The set of coefficients determining the target field from any AoA $\phi$ for $0<\phi<2\pi$ may be obtainable from $$[c_{-M',\phi}, c_{-M'-1,\phi}\ldots c_{M'-1,\phi}, c_{M',\phi}] = \\ [e^{-j(-M')\phi}, e^{-j(-M'+1)\phi},\ldots e^{-j(M'-1)\phi}, e^{-j(M')\phi}]* \\ [c_{-M',0}, c_{-M'+1,0}\ldots c_{M'-1,0}, c_{M',0}], \quad (8)$$

where * stands for element-wise vector multiplication.

What is written above shows how the Fourier technique can be used to determine the set of coefficients $c_{m',0}$ for m'=-M' ... M' for the target electric field arriving from an anglec $\phi$. In application of equation (7) one can also have a larger number of electric field values on the right-hand side of equation (7) than K (the number of antennas), hence leading to a larger number of coefficients $c_{m',0}$ on the left-hand side of equation (7). In this case, the right K number of coefficients $c_{m',0}$, with indices m'=-M' ... M', may then be picked from the middle of the Fourier spectrum.

Next, it can be shown how the Fourier technique can be used to generate by antennas 102 to 116 such a field on the intersection circle at the radius $|\bar{r}|$ that has the same Fourier coefficients $c_{m',\phi}$ as the target field from AoA $\phi$ has.

The following 3 steps may be repeated for each m'=-M' ... M'.

Step 1: Consider the above mentioned intersection circle, and assume that you have K OTA antennas 102 to 116 at the same distance from the centre of the test zone and assume that the excitation vector for the K OTA antennas is as follows:

$$\bar{c}_{m'} = [e^{-jm'\theta_1}, e^{-jm'\theta_2} \ldots e^{-jm'\theta_{K-1}}, e^{-jm'\theta_K}] \quad (9)$$

If the distances are different but still predetermined, a corresponding result may be derived. Here the elements of this vector are the excitations for the OTA antennas, and $\theta_{K'}$ is the k'th OTA antenna. The $\theta_1$ is assumed to be 0 for simplicity.

Step 2: Suppose now that the field on the intersection circle created by the OTA antennas with the excitation vector as given in equation (9) is $e_{z,m'}(\Delta\theta, |\bar{r}|)$. Then perform the IDFT of the this field as $$\bar{d}_{m'} = \text{IDFT}[e_z(\theta_1, |\bar{r}|), e_z(\theta_2, |\bar{r}|) \ldots e_z(\theta_L, |\bar{r}|)], \quad (10)$$

which provides you with vector $\bar{d}_{m'}$. Here L is the number of points equispaced by $\Delta\theta$ on the intersection circle around the DUT 100. If L>K, this vector $\bar{d}_{m'}$ contains the Fourier coefficients with indices m' outside the range [−M' ... M'], the middle part of the Fourier spectrum may be chosen by forming a new vector $\bar{d}_{m'}$ as follows: $\bar{d}_{m'} = [d_{-M'}, d_{-M'+1} \ldots d_{M'-1}, d_{M'}]$.

Step 3: Now, take the $M'^{th}$ component of vector $\bar{d}_{m'}$, that is denoted $d_{m'}$, and create another excitation vector as follows:

$$\bar{b}_{m'} = \frac{c_{m',\varphi}}{d_{m'}} [e^{-jm'\theta_1}, e^{-jm'\theta_2} \ldots e^{-jm'\theta_{K-1}}, e^{-jm'\theta_K}], \quad (11)$$

where j is the imaginary unit. Hence, the vector $\bar{c}_{m'}$ in equation (9) differs from vector $\bar{b}_{m'}$ in equation (11) only by factor $$\frac{c_{m',\varphi}}{d_{m'}},$$

where $c_{m',\varphi}$ is the Fourier coefficients of the target field in equation (8).

After repeating these 3 steps for each m'=−M' ... M', K vectors $\bar{b}_{m'}$ may be obtained. Finally, the excitation vector $\bar{a}_{m'}$ may be formed by element-wise summing of the vectors $\bar{b}_{m'}$ as follows:

$$\bar{a}_{m'} = \sum_{m'=-M'}^{M'} \bar{b}_{m'} \quad (12)$$

where M' refers to a truncated value of series expansion. This vector $\bar{a}_{m'}$, which is actually the same as the weight vector G, is the excitation vector for the OTA antennas 102 to 116 that provides the electric field at the intersection circle around the DUT 100 which makes the communication signal experience the radio channel of the radio channel model at least approximately. When the electric field also fulfils the requirements on the intersection circle, the electric field fulfils the requirements inside the intersection circle. Instead of a circle, another shape for the intersection line may be applied.

In an embodiment, a matrix inversion may be utilized. This resembles the method of a cost function (see eq. (2)).

Weights $g_k$ for a single plane wave may be obtained by solving an OTA antenna weight vector G from the following matrix equation, for example $$FG=T, \quad (13)$$

where $F=\{\alpha_{m,k}\}$, $\alpha_{m,k} \in C$ is a M×K transfer matrix of coefficients from $k^{th}$ OTA antennas to $m^{th}$ location $\bar{r}_m$ on the basis of the configuration of OTA antennas, M is the number of locations associated with test zone 126, $G=\{g_k\}$, $g_k \in C$ is a K×1 vector of OTA antenna complex weights, $T=\{e_z(\bar{r}_m)\}$ is a M×1 vector of the complex target field values $e_z(\bar{r}_m)$ in locations $\bar{r}_m$ (of a plane wave with AoA $\varphi$), $\bar{r}_m$ is a location vector pointing to $m^{th}$ sample point.

The transfer coefficient from $k^{th}$ OTA antennas to $m^{th}$ location $\bar{r}_m$ comprises a path loss term and a phase term $\alpha_{m,k}=\text{PL}(d_{k,m})\exp(-j\beta\bar{r}_m\cdot\bar{\theta}_k)$.

The target field for a plane wave may be expressed as $$e_z(\bar{r}_m)=E_0 \exp(-j\bar{\beta}\cdot\bar{r}_m) \quad (14)$$

where $\bar{\beta}$ is a wave vector ($\|\bar{\beta}\|=2\pi/\lambda_0$) pointing from AoA direction, $\lambda_0$ is the wavelength of the carrier frequency $f_c$, and $E_0=1$.

Since matrices F and T may be constructed on the basis of predetermined information on the antenna configuration in the OTA chamber, the weight vector G can be solved. If M=K, the weight matrix G may be computed by a matrix inversion $$G=F^{-1}T. \quad (15)$$

In general, it may be beneficial to specify more sample points and get an over-determined problem (M>K). In this case the target is to optimize or minimize squared $L^2$-norm. When optimizing, the operation may be expressed as $$Th \geq \|FG-T\|_2^2, \quad (16)$$

where Th is a threshold at or below which a square of an absolute value of the difference between matrices FG and T should be. Hence, any weight vector G which fulfils the inequality may be selected for the antennas 102 to 116.

When minimizing, the operation may expressed in the form $$\min_{G} \|FG - T\|_2^2,$$

for example, where $$\min_{G}$$

means a minimizing operation with respect to the weight matrix G and $\|FG-T\|_2^2$ means a square of an absolute value of the difference between matrices FG and T. The weights which may be solved by pseudo inverse operation $$G=(F^H F)^{-1} F^H \cdot T, \quad (17)$$

where $F^H$ refers to Hermiten matrix.

Equations (2) and (17) apply in two-dimensional and three-dimensional configurations. To extend equation (17) to different polarizations, the definition of T should be extended to cover both AoA and (linear) polarization state. For example, three different (x,y,z) polarization vector components ($e_x$, $e_y$, $e_z$) could be defined in locations $\bar{r}_m$.

In an embodiment, Doppler shifts may also be taken into account in the weights G. A virtual motion of the DUT 100 may be used to create Doppler shifts to the plane waves. The Doppler shift $\omega_d$ to a plane wave from AoA $\phi$ resulting from virtual motion $\bar{v}$ having a certain strength and direction (see FIG. 2) may be expressed as $$\omega_d = -\bar{\beta} \cdot \bar{v}. \quad (18)$$

The Doppler shift may be introduced to each plane wave by multiplying a Doppler frequency component $\omega_d$ ($=2\pi f_d$, where $f_d$ is a Doppler frequency) with the complex weight vector G. That may be done by making the complex weights $w_k$ of weight vector G time dependent as follows $$w_k(t) = g_k \exp(jt\omega_d), \quad (19)$$

where t is the time and j is the imaginary unit. Now, the received field at an arbitrary location m within the test zone, neglecting the path loss, may be expressed as $$E_z(t, \bar{r}_m) = \sum_{k=1}^{K} w_k(t) \exp(-jt\beta(\bar{r}_m \cdot \bar{\theta}_k)\omega_c) \quad (20)$$

$$= \sum_{k=1}^{K} g_k \exp(-j\bar{\beta}\bar{r}_m \cdot \bar{\theta}_k) \exp(jt(\omega_d + \omega_c))$$

where $\omega_c = 2\pi f_c$ and $f_c$ is the carrier frequency.

Above, weight vector G for only one plane wave has been considered. As a plurality of plane waves are typically needed for creating the desired radio channel for each output of the transmitter, weight vectors G of each plane wave should be combined for forming a combined weight vector $G_c$ for each signal path 130. The vectors G may be combined as a sum of vectors, $$g_{k,c} = \sum_{i=1}^{P} g_{k,i},$$

where $g_{k,c}$ is an element of $G_c$, P is the number of plane waves and k refers to an OTA antenna 102 to 116.

As presented above, a combination of weight vectors G determines the directions, frequencies, phases and amplitudes of the plane waves. Hence, an emulated radio channel may be based on a superposition of plane waves in the test zone 126.

Figure 3:
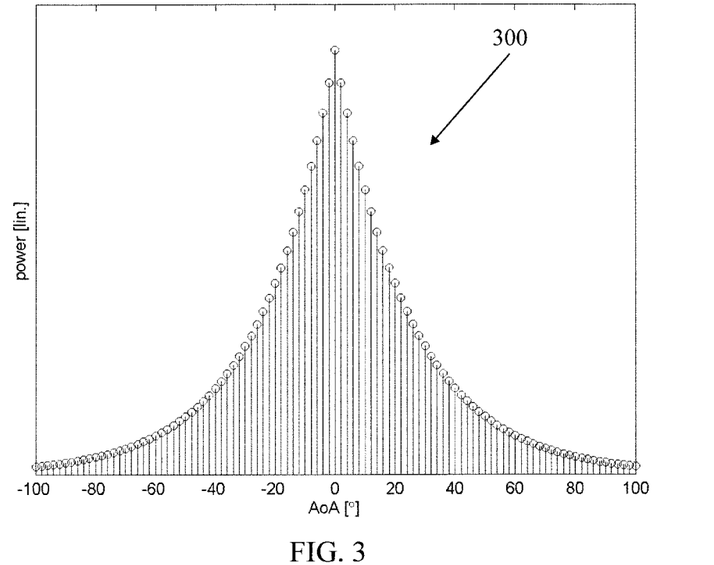
FIG. 3 shows a PAS sampled uniformly.

FIG. 3 presents a PAS (Power Angular Spectrum). A specific power angular density function may be formed within the test zone 126 by introducing a plurality of plane waves with an appropriate AoA and magnitude. The AoA space may be sampled uniformly according to the target PAS, as in FIG. 3, with N plane waves 300 having a suitable power $P_n$ determined by a weight. Each small circle represents a wave plane with a power shown on the power axis transmitted by the antennas 102 to 116 from an angle shown on the AoA axis.

Figure 4:
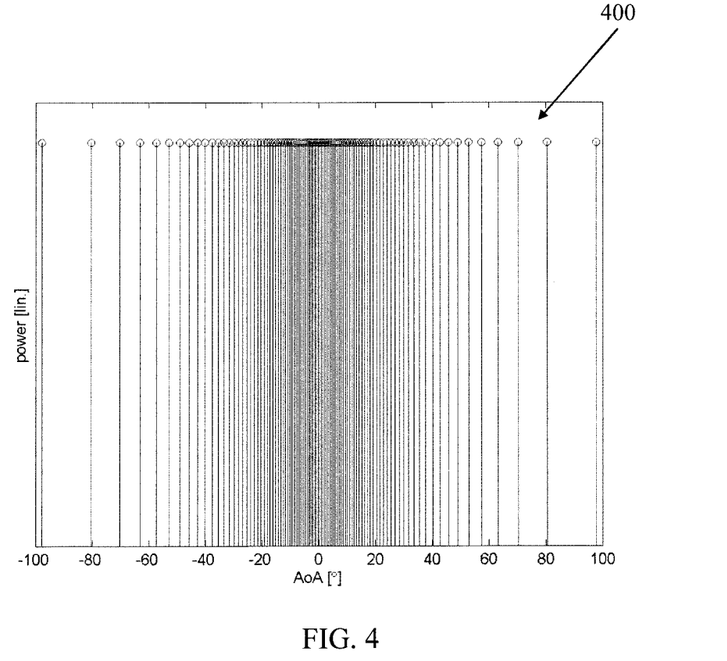
FIG. 4 shows a PAS sampled non-uniformly.

FIG. 4 presents another option to fix powers and sample the angular space. Each small circle represents a wave plane with a power shown on the power axis transmitted by the antennas 102 to 116 from an angle shown on the AoA axis. The target PAS may be created by having a higher density of samples around an angle of the peak power than elsewhere. In both cases, each plane wave 400 n, n=1, . . . , N, has a specific AoA $\phi_n$ and power $P_n$. Also the Doppler shift $\omega_{d,n}$ may be unique for each plane wave depending on AoA and velocity vector of the virtual motion. The Doppler shift is determined by the channel model (i.e. PAS), the carrier centre frequency, the virtual speed and the direction of motion.

The implementation of delay dispersion is straightforward in the presented fading emulator set-up. The propagation of each discrete delay component is assumed to be independent. Thus, weights for different delay taps may be generated applying the same principles as for a single plane wave and an arbitrary power angular spectrum (see FIG. 7).

Figure 5:
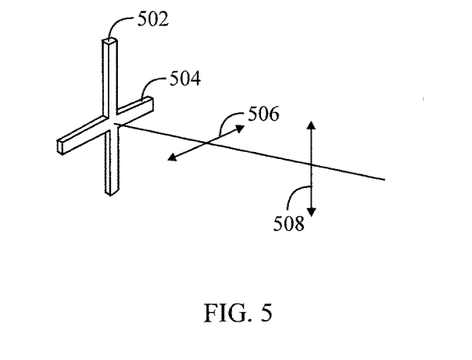
FIG. 5 shows an antenna with two polarization planes.

In an embodiment, polarization may be taken into account. FIG. 5 presents an antenna 500 having antenna elements 502, 504 for two orthogonal polarizations. Orthogonal polarization components 506, 508 (e.g. vertical V and horizontal H) may be created independently by two co-located and orthogonally polarized OTA antenna elements, for example. A single plane wave composed by orthogonally polarized signal components is linearly polarized if $g_k^V = A g_k^H$, $A \in R$, where $g_k^V$ and $g_k^H$ are complex weights for vertically and horizontally polarized OTA antenna elements of the $k^{th}$ OTA antenna position. Hence, a linear polarization follows if polarization components 506, 508 have constant magnitude difference and equal phase in equation (21) below $$E(t, \bar{r}_m) = \sum_{k=1}^{K} \begin{bmatrix} g_k^V \\ g_k^H \end{bmatrix} \exp(-j\bar{\beta}\bar{r}_m \cdot \bar{\theta}_k) \exp(jt(\omega_d + \omega_c)). \quad (21)$$

A single plane wave may also be made circularly or elliptically polarized by introducing a phase term $\alpha$. In that case, the complex weight coefficients may be written as:

$$g_k^V = A g_k^H e^{j\alpha}. \quad (22)$$

A superposition of multiple plane waves, including a fast fading radio channel on the basis of a Doppler frequency $\omega_{d,n}$, in an arbitrary location x may be expressed as:

$$E(t, \bar{r}_m) = \sum_{n=1}^{N} \sum_{k=1}^{K} \begin{bmatrix} g_{n,k}^V \\ g_{n,k}^H \end{bmatrix} \exp(-j\bar{\beta}\bar{r}_m \cdot \bar{\theta}_k) \exp(jt(\omega_{d,n} + \omega_c)). \quad (23)$$

The summing over N results usually in a plurality of sine waves of different frequencies which provide plane waves the interference of which leads to a Rayleigh fading channel for a communication signal. Equation (23) has an arbitrary (or time varying elliptical) polarization if phase differences $\alpha_n$ and/or magnitude differences $A_n$ of the polarization components of plane waves n are arbitrary in $$g_{n,k}^V = A_n g_{n,k}^H e^{j\alpha_n}. \quad (24)$$

Figure 6:
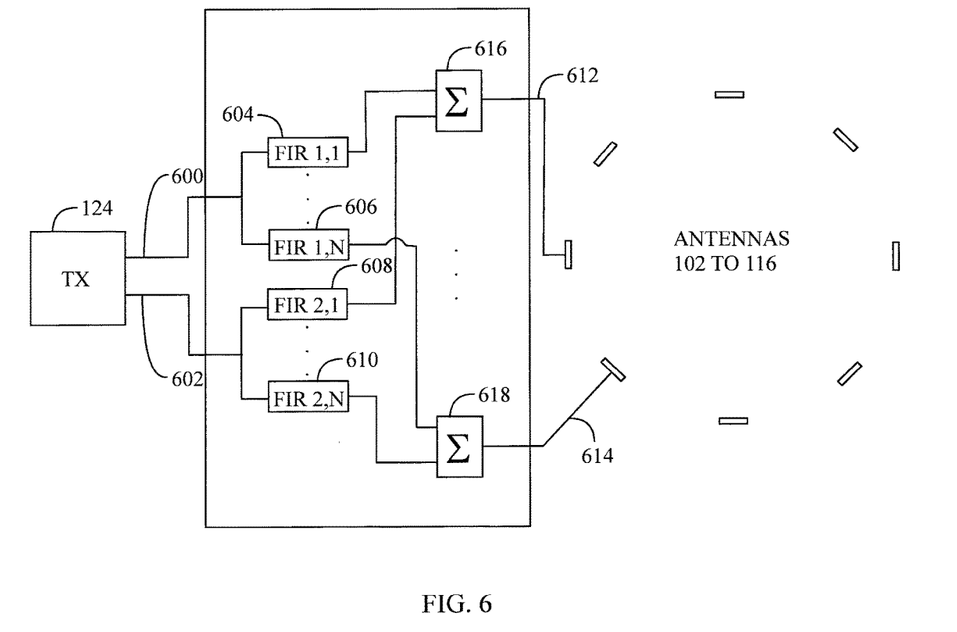
FIG. 6 shows FIR filters and combiners for forming signals fed to antennas for forming plane waves.

FIG. 6 presents an embodiment of an emulation system which may be multiple-input-multiple-output system (MIMO system).

The channel model for a MIMO OTA is a geometric antenna independent. When plane geometry is concerned, the parameters of a radio channel may be as follows:
power (P), delay ($\tau$),
azimuth angle of arrival (AoA), angle spread of arrival azimuth angles (ASA), shape of clusters (PAS),
azimuth angle of departure (AoD), angle spread of departure azimuth (ASD), shape of PAS,
cross polarization power ratio (XPR).

When solid geometry is concerned, the additional parameters of a radio channel may be as follows:

elevation angle of arrival (EoA), angle spread of arrival elevation angles (ESA), shape of PAS, elevation angle of departure (EoD), angle spread of departure elevation angles (ESD), shape of PAS.

The parameters may be used for forming the weights.

The transmitter 124 has at least one output 600, 602 for feeding a communication signal to the emulator 118. FIG. 6 shows two outputs but in general there may be only one output or more than two outputs. Each output 600, 602 may be coupled with a plurality of filters 604, 606, 608, 610. In general, there may be a plurality of filters for each output. The number of filters may be the same as the number of antennas 102 to 116. Each filter 604 to 610 may be a FIR filter which receives a weight vector H of each signal path 612, 614 from the weight generator 122. The weight vector H may be the weight vector $G_c$ but it may also include the features relating to crosstalk between the polarization planes and effects of the transmitter 124 and the receiver i.e. the DUT 100 presented later in equation (25), for example.

Examine now the first output 600. For example, the weight H of the first signal path 612 interacts with communication signal of the first output 600 of the transmitter in the filter 604. Similarly, the weight H of another signal path 614 interacts with communication signal of the first output 600 of the transmitter in the filter 606. The same is performed for all signal paths in filters associated with them, each signal path being coupled with one antenna 102 to 116.

Examine now the second output 602. For example, the weight H of the first signal path 612 interacts with communication signal of the second output 602 of the transmitter in the filter 608. Similarly, the weight H of another signal path 614 interacts with communication signal of the second output 602 of the transmitter in the filter 610. The same is performed for all signal paths in filters associated with them, each signal path being coupled with one antenna 102 to 116. Then the weighted signals for the same antenna may be combined in summers 616, 618. The combined signals from each summer 616, 618 may be coupled to an antenna 102 to 116. FIG. 6 does not show all filters, summers and signal paths for clarity reasons.

Figure 7:
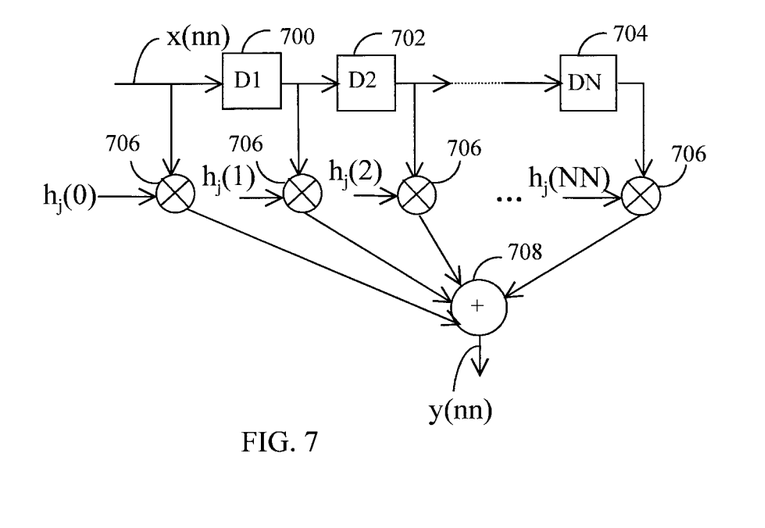
FIG. 7 shows a structure of a FIR filter.

FIG. 7 shows a block diagram of a FIR filter which may comprise delay elements 700 to 704 arranged as a shift register, multipliers 706 and a summer 708. The basic function of an FIR filter may be described as follows. The digital input signal x(nn) is delayed in each delay element 700 to 704, whose delays may have the same or different length in time, and the delayed signals are multiplied in the multipliers 706 by the desired weights $h_j(ii)$ formed by the weight generator 122, where j=[1, . . . , KK]. The plane waves in a signal path may be defined by the weights $H_j$=[h(0), . . . , h(MM)], which are also called tap coefficients of a FIR filter. The signal components are summed together in a summer 708. The delay dispersion may be controlled by weighting different delays of the input signals x(nn) differently. The coefficients may be formed by summing the right sides of the equations (27) and (28) over the variable n (i.e. over n plane waves).

In a mathematical form, the output signal y(nn) of a FIR filter may be expressed as a convolution of the sum of the product of the delayed signal and the weights:

$$y(nn) = x * h = \sum_{k=1}^{NN} h(k)x(nn-k),$$

where * denotes a convolution operation and n denotes the index of a signal element. Signals x and y and a weight h may be processed in a scalar form, vector form or matrix form. Generally, weights h may be real or complex.

As shown in FIG. 6, the weights H providing the desired radio channel model (impulse response files) may be created for U transmitter outputs (outputs refer to transmitter antennas) and K OTA antennas. In a case having only one predetermined polarization plane, UK separate filters 604 to 610 are needed. In a case having two predetermined polarization planes, 2UK (K times co-located V&H elements) separate filters are needed. Hence, corresponding weights are generated in the weight generator 122.

In the following, it is shown how transmitter antenna field patterns and also receiver characteristics may be embedded in a single plane wave. The weight $H_{u,k,n}$ from an output u (600, 602) of a transmitter 124 to OTA antenna k (102 to 116) for $n^{th}$ plane wave may be expressed as follows:

$$H_{u,k,n}(t) = \sqrt{P_n} \begin{bmatrix} F_{rx,k,V}(\varphi_n) \\ F_{rx,k,H}(\varphi_n) \end{bmatrix}^T \begin{bmatrix} g_{n,k}^V & 0 \\ 0 & g_{n,k}^H \end{bmatrix} \begin{bmatrix} X_n^{VV} & X_n^{VH} \\ X_n^{HV} & X_n^{HH} \end{bmatrix} \begin{bmatrix} F_{tx,u,V}(\phi_n) \\ F_{tx,u,H}(\phi_n) \end{bmatrix} . \quad (25)$$

$$\exp(j\beta \bar{q}_u \cdot \bar{\phi}_n)\exp(jt(\omega_{d,n} + \omega_c))$$

where $X_n^{HV}$ is an element of a complex polarization matrix to H polarization from V polarization i.e. crosstalk between polarization planes, $\phi_n$ is AoD (Angle of Departure) of the $n^{th}$ plane wave, $F_{tx,u,V}(\phi_n)$ is a complex gain of $u^{th}$ transmitter antenna of V polarization on AoD $\phi$, $\bar{\phi}_n$ is a unit vector of a departure angle $\phi$, and $\bar{q}_u$ is the location vector of an array element u of a transmitter. The 2×2 polarization matrix contains magnitude differences due to cross polarization power ratio and phase differences due to polarization states (e.g. circular polarization). It may be assumed that field patterns of the transmitter 124 include the phase differences between antenna elements of the transmitter caused by element positions, mutual coupling, etc.

The equation (25) can be simplified to a form $$H_{u,k,n}(t) = \sqrt{P_n}\, e^{jt(\omega_{d,n}+\omega_c)} e^{j\beta \bar{q}_n \cdot \bar{\phi}_n} \begin{bmatrix} F_{rx,k,V}(\varphi_n) \\ F_{rx,k,H}(\varphi_n) \end{bmatrix}^T \begin{bmatrix} g_{n,k}^B & 0 \\ 0 & g_{n,k}^H \end{bmatrix} \quad (26)$$

$$\begin{bmatrix} X_n^{VV} & X_n^{VH} \\ X_n^{HV} & X_n^{HH} \end{bmatrix} \begin{bmatrix} F_{tx,u,V}(\phi_n) \\ F_{tx,u,H}(\phi_n) \end{bmatrix}$$

$$= \sqrt{P_n}\, e^{jt(\omega_{d,n}+\omega_c)} e^{j\beta \bar{q}_u \cdot \bar{\phi}_n}$$

$$((F_{rx,k,V} g_{n,k}^V X_n^{VV} + F_{rx,k,H} g_{n,k}^H X_n^{HV}) F_{tx,u,V} +$$

$$(F_{rx,k,V} g_{n,k}^V X_n^{VH} + F_{rx,k,H} g_{n,k}^H X_n^{HH}) F_{tx,u,H})$$

where symbols of AoA and AoD have been dropped out for notational simplicity. For the V polarized element of $k^{th}$ OTA antenna it may be assumed that $F_{rx,k,V}(\phi_n)$=1 and $F_{rx,k,H}(\phi_n)$=0.

A weight for a signal path from antenna u of a transmitter to V polarized OTA antenna k for $n^{th}$ plane wave may be written as:

$$H_{u,k,V,n}(t) = \sqrt{P_n} \exp(jt(\omega_{d,n} + \omega_c))$$
$$\exp(j\beta \bar{q}_u \cdot \bar{\phi}_n)(F_{tx,u,V} w_{n,k}^V X_n^{VV} + F_{tx,u,H} w_{n,k}^V X_n^{VH}). \quad (27)$$

A weight for a signal path from transmitter antenna u to H polarized OTA antenna k for $n^{th}$ plane wave may be written as:

$$H_{u,k,H,n}(t) = \sqrt{P_n} \exp(it(\omega_{d,n} + \omega_c))$$
$$\exp(j\beta \bar{q}_u \cdot \bar{\phi}_n)(F_{tx,u,V} w_{n,k}^H X_n^{HV} + F_{tx,u,H} w_{n,k}^H X_n^{HH}). \quad (28)$$

From equations (27) and (28) it may be concluded that an effect of transmitter 124 particularly due to transmitter's antenna and transmitter's side propagation effects (resulting to transmitter's antenna correlation and possible power imbalance, for example) may be included in the weights using the term $F_{tx}$ according to what is described in the above equations. Similarly, also the receiver's effect may be included in the weights using the term $F_{rx}$. This is not a computationally complex task, because all the aforementioned effects are time invariant (except for circular polarized transmission). Superposition of multiple plane waves transmitted by OTA antennas and received by a DUT antenna results in realistically transmitter signals through a radio channel.

It should be noted that the plane waves may have a variety of frequencies in the test zone 126 which are quite different from the carrier frequency of the transmitter. Their interference which is based on the interference of the basis waves shapes the electric field in the test zone. The basis waves, in turn, are based on the carrier(s) of the transmitter although the frequency may have changed due a Doppler effect. The shape of the electric field which may be all the time changing forms the radio channel for the communication signal coming from the transmitter. One plane wave creates spatial-flat, temporal-flat and frequency-flat channel. All these three domains (space, time and frequency) may be controlled separately with a plurality of plane waves. For example, it is possible to create static propagation conditions with spatial fading only (temporally static). This may be performed by adjusting constant amplitude and phase weight for each of the OTA antennas. For making a communication signal to experience Rayleigh fading, a plurality of plane waves with different frequencies (Doppler shift) and with different phases may be formed simultaneously. Different frequencies provide the electric field in the test zone 126 with sharp enough notches similar to real radio environment. Plane waves with phase shifts but without a Doppler effect provide the test zone 126 with a static channel. To create frequency variation of the radio channel, a plurality of plane waves with a slightly different delays may be generated. To change polarization, phase and amplitude differences may be adjusted between dual-polarized antennas. With the solution presented above it is possible to form effectively line-of-sight signals to the test zone 1126 from the angles between the OTA antennas which is problematic in the prior art. A line-of-sight signal may directed to the DUT from any angle, also from an angle between two antennas.

Figure 8:
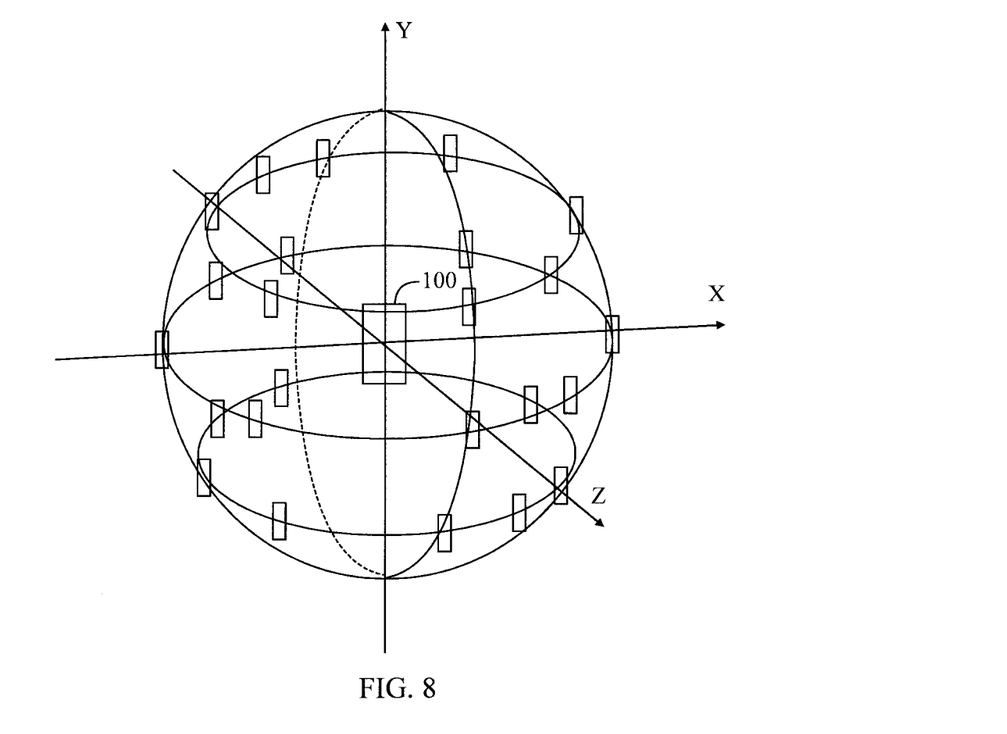
FIG. 8 shows a solid geometrical configuration of OTA antennas.

FIG. 8 presents a solid geometrical embodiment of an OTA test chamber. In this example, the antenna elements (rectangles) are placed (as if) on a surface of a sphere while the DUT 100 is in the middle of the sphere. However, the surface on which the antenna elements are (as if) placed may be a part of any surface which encloses a volume. Examples of such surfaces are a surface of a cube, an ellipsoid, a tedraedra, etc.

Figure 9:
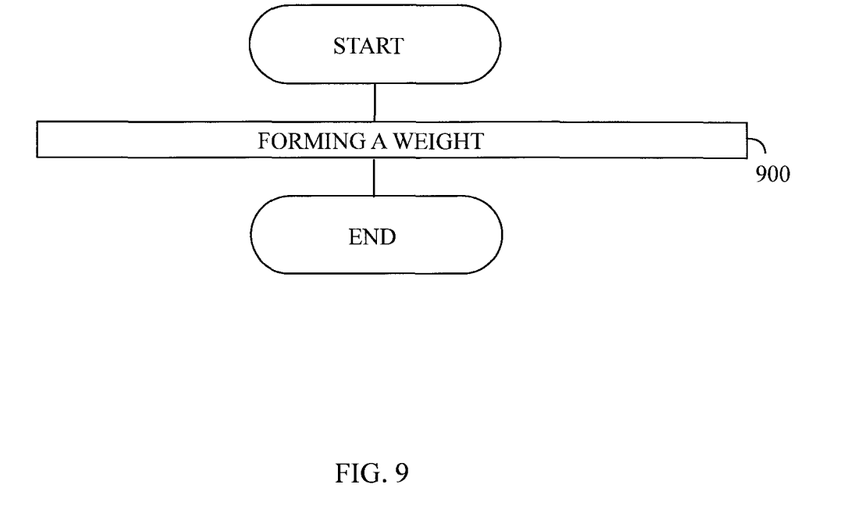
FIG. 9 shows a flow chart of the method of forming weights.

FIG. 9 presents a flow chart of the method for forming a weight. In step 900, a weight for each signal path associated with an antenna of a plurality of antennas around a test zone in an over-the-air chamber is formed by comparing of a desired target electric field based on a radio channel model and an electric field obtainable by the plane waves associated with the test zone, the plane waves being transmittable by the antennas and being based on at least one basis waveform in each signal path.

Figure 10:
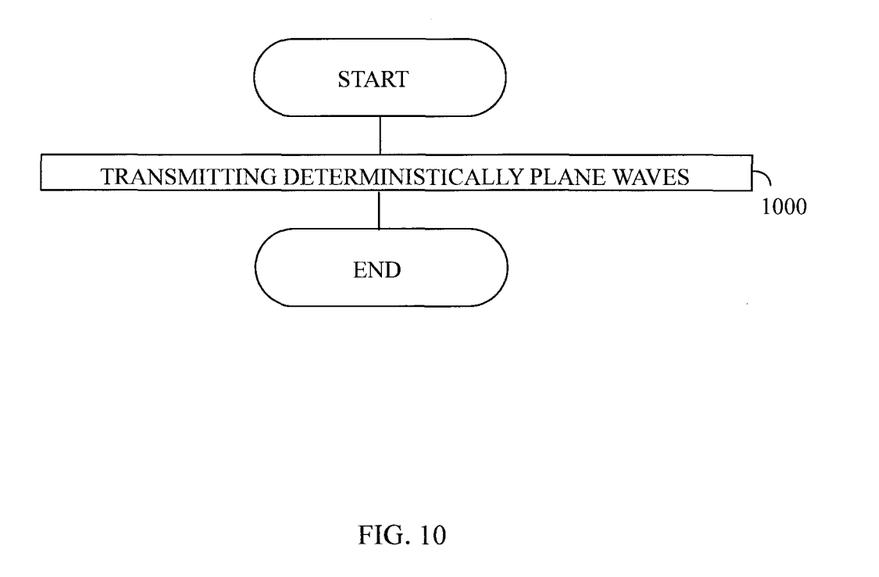
FIG. 10 shows a flow chart of method of transmitting plane waves.

FIG. 10 presents a flow chart of a transmission method. In step 1000 basis waveforms from the antenna elements of an over-the-air chamber are transmitted deterministically for forming a plurality of predetermined plane waves in a test zone, the predetermined plane waves forming an emulated radio channel for communication with the device under test in the test zone.

The weight generator 122 and/or the emulator 118 may be implemented as an electronic digital computer, which may comprise a working memory (RAM), a central processing unit (CPU), and a system clock. The CPU may comprise a set of registers, an arithmetic logic unit, and a control unit. The control unit is controlled by a sequence of program instructions transferred to the CPU from the RAM. The control unit may contain a number of microinstructions for basic operations. The implementation of microinstructions may vary, depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions.

An embodiment provides a computer program embodied on a distribution medium, comprising program instructions which, when loaded into an electronic apparatus, execute the method described above in connection with FIGS. 9 and 10.

The computer program may be in source code form, object code form, or in some intermediate form, and it may be stored in some sort of carrier, which may be any entity or device capable of carrying the program. Such carriers include a record medium, computer memory, read-only memory, and software distribution package, for example. Depending on the processing power needed, the computer program may be executed in a single electronic digital computer or it may be distributed amongst a number of computers.

It will be obvious to a person skilled in the art that, as technology advances, the inventive concept can be implemented in various ways. The invention and its embodiments are not limited to the examples described above but may vary within the scope of the claims.

What is claimed is:

1. An apparatus configured to form a weight for each signal path associated with an antenna of a plurality of antennas around a test zone in an over-the-air chamber by a comparison of a predetermined target electric field based on a radio channel model and an electric field obtainable by plane waves associated with the test zone, the plane waves being transmittable by the antennas and being based on at least one basis waveform in each signal path, a desired channel being formed between a transmitter and a device under test based on a superposition of the plane waves in the test zone, wherein each plane wave is based on a plurality of basis waveforms.

2. The apparatus of claim 1, wherein at least two basis waveforms of at least one common plane wave are configured to be transmitted in one signal path.

3. The apparatus of claim 1, wherein the apparatus is configured to form a weight for each signal path for each plane wave on based on a difference between a desired target electric field determined by the radio channel model and an electric field obtainable by each plane wave transmittable by the plurality of antennas, and to combine weights of each antenna for forming a weight of a plurality of plane waves for a signal path.

4. The apparatus of claim 1, wherein the apparatus is configured to form a weight for each signal path for each plane wave by optimizing a difference between a desired target electric field determined by the radio channel model and an electric field obtainable by each plane wave transmittable by the plurality of antennas.

5. The apparatus of claim 1, wherein the weight for each signal path is configured to determine directions, frequencies, phases, and amplitudes of the plane waves for an emulated radio channel being based on a superposition of plane waves in the test zone.

6. The apparatus of claim 1, wherein the apparatus is configured to perform the comparison at a plurality of locations at a circumference of the test zone.

7. The apparatus of claim 1, wherein the apparatus is configured to include a time dependent Doppler shift in the weight for each signal path.

8. The apparatus of claim 1, wherein the apparatus is configured to form a weight for each signal path for different polarization planes based on the polarization planes of the plurality of antennas.

9. The apparatus of claim 7, wherein the apparatus is configured to include crosstalk between different polarization planes in the weight for each signal path.

10. The apparatus of claim 7, wherein the apparatus is configured to include at least one of weight for each signal path: transmitter's effects on transmission; and receiver's effect on reception.

11. The apparatus of claim 1, wherein a weight generator is configured to save the weight for each signal path in a memory for emulation of a radio channel.

12. The apparatus of claim 1, wherein the apparatus is configured to receive at least two signals having different radio channels, to form a weight for each radio channel and to combine weights for each signal path to form plane waves for each radio channel.

13. A method comprising forming a weight for each signal path associated with an antenna of a plurality of antennas around a test zone in an over-the-air chamber by comparing of a predetermined target electric field based on a radio channel model and an electric field obtainable by plane waves associated with the test zone, the plane waves being transmittable by the antennas and being based on at least one basis waveform in each signal path, a desired channel being formed between a transmitter and a device under test based on a superposition of the plane waves in the test zone, wherein each plane wave is based on a plurality of basis waveforms.

14. The method of claim 13, wherein at least two basis waveforms of at least one common plane wave is transmittable in one signal path.

15. The method of claim 13, the method further comprising forming a weight for each signal path for each plane wave based on a difference between a desired target electric field determined by the radio channel model and an electric field obtainable by each plane wave transmittable by the plurality of antennas, and combining weights for each antenna for forming a weight for a plurality of plane waves.

16. The method of claim 13, the method further comprising forming a weight for each signal path for each plane wave by optimizing a difference between a desired target electric field determined by the radio channel model and an electric field obtainable by each plane wave transmittable by the plurality of antennas.

17. The method of claim 13, the method further comprising determining by the weight for each signal path, directions, frequencies, phases, and amplitudes of the plane waves, an emulated radio channel being based on a superposition of plane waves in the test zone.

18. The method of claim 13, the method further comprises performing the comparing at a plurality of locations at a circumference of the test zone.

19. The method of claim 13, the method further comprises including a time dependent Doppler shift in the weight for each signal path.

20. The method of claim 13, the method further comprising forming the weight for each signal path for different polarization planes based on the polarization planes of the plurality of antennas.

21. The method of claim 20, the method further comprises including crosstalk between different polarization planes in the weights.

22. The method of claim 13, the method further comprising including at least one of the following in the weight for each signal path: transmitter's effects on transmission; and receiver's effect on reception.

23. The method of claim 13, the method further comprises receiving at least two signals of different radio channels, forming a weight for each radio channel and combining weights for each signal path to form plane waves for each radio channel.

24. An apparatus comprising: at least one processor and at least one non-transitory computer readable medium including a computer program code, the at least one non-transitory computer readable medium and the computer program code with the at least one processor are configured to cause the apparatus to perform operations comprising:
forming a weight for each signal path associated with an antenna of a plurality of antennas around a test zone in an over-the-air chamber by comparing of a predetermined target electric field based on a radio channel model and an electric field obtainable by plane waves associated with the test zone, the plane waves being transmittable by the antennas and being based on at least one basis waveform in each signal path, a desired channel being formed between a transmitter and a device under test based on a superposition of the plane waves in the test zone, wherein each plane wave is based on a plurality of basis waveforms.

25. An emulation system comprising:
an apparatus configured to form a weight for each signal path associated with an antenna of a plurality of antennas around a test zone in an over-the-air chamber by a comparison of a predetermined target electric field based on a radio channel model and an electric field obtainable by plane waves associated with the test zone, the plane waves being transmittable by the plurality of antennas and being based on at least one basis waveform in each signal path, a desired channel being formed between a transmitter and a device under test based on a superposition of the plane waves in the test zone, wherein each plane wave is based on a plurality of basis waveforms;

an emulator coupled to the apparatus for receiving the weight for each signal path; and a transmitter coupled to the emulator for feeding a communication signal, the antennas being configured to receive signals from signal paths of the emulator and transmit plane waves based on signals from the emulator for forming an emulated radio channel between the transmitter and the device under test.

26. An emulation system of claim 25, wherein the transmitter has at least one output coupled to the emulator for feeding the communication signal, each output referring to a unique radio channel; and the apparatus being configured to form weights with respect to each output separately for forming plane waves for the plurality of antennas.

27. A transmission method comprising:

transmitting deterministic basis waveforms from antenna elements of an over-the-air chamber for forming a plurality of predetermined plane waves in a test zone, the predetermined plane waves forming an emulated radio channel for communication with a device under test in the test zone, a desired channel being formed between a transmitter and a device under test based on a superposition of the predetermined plane waves in the test zone, wherein each plane wave is based on a plurality of basis waveforms.

* * * * *

UNITED STATES PATENT AND TRADEMARK OFFICE
CERTIFICATE OF CORRECTION

PATENT NO. : 9,705,190 B2
APPLICATION NO. : 13/038703
DATED : July 11, 2017
INVENTOR(S) : Pekka Kyosti et al.

It is certified that error appears in the above-identified patent and that said Letters Patent is hereby corrected as shown below:

On the Title Page

In item (73), in Column 1, in "Assignee", Line 2, delete "Ptd." and insert -- Pte. --, therefor.

Signed and Sealed this
Third Day of April, 2018

Andrei Iancu
*Director of the United States Patent and Trademark Office*